(12) United States Patent
Hsu et al.

(10) Patent No.: US 7,618,574 B2
(45) Date of Patent: Nov. 17, 2009

(54) IMPRINT LITHOGRAPHY UTILIZING SILATED ACIDIC POLYMERS

(75) Inventors: Lien-Chung Hsu, Tainan (TW);
Weng-Chung Liao, Pingtung (TW);
Min-Hsiung Hon, Tainan (TW);
Chau-Nan Hong, Tainan (TW)

(73) Assignee: National Cheng Kung University, Tainan (TW)

( * ) Notice: Subject to any disclaimer, the term of this patent is extended or adjusted under 35 U.S.C. 154(b) by 837 days.

(21) Appl. No.: 11/180,512

(22) Filed: Jul. 14, 2005

(65) Prior Publication Data
US 2007/0012652 A1    Jan. 18, 2007

(51) Int. Cl.
*B29C 41/46*    (2006.01)
(52) U.S. Cl. .................. 264/319; 264/299; 264/310
(58) Field of Classification Search .............. None
See application file for complete search history.

(56) References Cited

U.S. PATENT DOCUMENTS 4,801,658 A  *  1/1989  Furukawa et al. ........... 525/450

FOREIGN PATENT DOCUMENTS

| JP | 02308801 A | * | 12/1990 |
| JP | 2003342128 A | * | 12/2003 |
| WO | WO 88/09527 | * | 12/1988 |

* cited by examiner

*Primary Examiner*—Joseph S. Del Sole
*Assistant Examiner*—James Sanders

(57) ABSTRACT

A synthesis for a silated acidic polymer by a copolymerization of several monomers includes one acidic monomer and one silated monomer. The silated acidic polymer is used as a resist barrier in imprint lithography and is easily removed by an environmental basic aqua-solution during the stripping process without using RIE (reactive ion etching) process or organic solvent at the last step of resist stripping so that the throughput is enhanced and good etching resistibility together with cost-saving is obtained.

7 Claims, 19 Drawing Sheets

| | |
|---|---|
| Acidic monomer | 5~15% (wt%) |
| Other function group | 10~20% (wt%) |
| Silicated monomer | 1.0~10% (wt%) |
| Initiator | 0.5~5% (wt%) |
| Additive | 0~5% |
| Solution | 45~83.5% |

FIG.3

|  | | |
|---|---|---|
| Mixing | MAA(g) | 16.5 |
| | MMA(g) | 10 |
| | n-BA(g) | 53 |
| | (3-Methacryloyloxypropyl) tris(trimethylsiloxy)silane | 2.5 |
| | PMA(g) | 100 |
| | IPA(g) | 25 |
| First addition | AIBN(g) | 1.50 |
| | PMA(g) | 25.00 |
| Second addition | AIBN(g) | 1.50 |
| | PMA(g) | 25.00 |
| | Tg | 40.8 |

FIG.6

| RF powder | 100 Watt |
|---|---|
| Pressure | 70 torr |
| CF$_4$ | 60 sccm |
| SF$_6$ | 50 sccm |
| O$_2$ | 80 sccm |
| Ar | 15 sccm |

FIG.9

| Etching time (min) | 10 | 20 | 30 | 40 | 50 | 60 | 70 | 80 | 90 |
|---|---|---|---|---|---|---|---|---|---|
| Residual thickness of acidic polymer resist (um) | 35.60 | 33.45 | 27.45 | 23.18 | 19.88 | 15.28 | 10.25 | 14.52 | - |
| Residual thickness of silicated acidic polymer resist (um) | 38.28 | 38.26 | 38.24 | 38.19 | 37.12 | 36.09 | 34.28 | 33.58 | 32.10 |

IMPRINT LITHOGRAPHY UTILIZING SILATED ACIDIC POLYMERS

FIELD OF THE INVENTION

The present invention relates to imprint lithography; more particularly, relates to synthesizing a plurality of monomers comprised of at least an acidic monomer and a silated monomer through copolymerization to obtain a polymer resist of a silated acidic polymer and removing the polymer resist by using a resist stripper of an environmental basic aqua-solution, which can be applied to products in the electric and the photoelectric fields, such as flexible LCD (liquid crystal display), soft PCB (printed circuit board), base photoelectric display, etc.

DESCRIPTION OF THE RELATED ARTS

In 1996, Stephen Chou first applied the compression molding in etching the lithography of a diode. Please refer to FIG. 12, which is a view showing an imprint lithography according to a prior art. As shown in the figure, the compression molding is similar to signaling. By a micro-etching of a prior art, such as a photomask, an electron beam, a focus ion beam, etc., a required pattern or negative mask is molded on a molding material [121], such as a silicon wafer. By using a polymethyl methacrylate (PMMA) as an 'ink', the PMMA [122] is spin-coated on a material of a device substrate [123]. Then, by using special equipment, an imprint lithography [124] is processed under a certain pressure and a certain temperature to imprint the molding material [121] on the PMMA [122], which imprints the pattern from the molding material [121] to the PMMA [122]. And then, a dry etching [125], such as by plasma or by reactive ionic etching (RIE), is processed to obtain the required pattern. The compression molding is also named as hot embossing imprint lithography.

Please refer to FIG. 13, which is a view showing a "Step and Flash" procedure for the imprint lithography according to the prior art. As shown in the figure, Prof. Willson's laboratory of Austin Division of Texas University reported a lithography by using a UV-curing, called 'Step and Flash'. Firstly, a double-layer material is spin-coated [131] on a silicon wafer by the 'Step and Flash' procedure. The double-layer material comprises a transfer layer and an upper layer of a photosensitive film (a photosensitive etching barrier), where a pattern is imprinted [132] analogously (1:1) on the passive layer with a transparent mold with stereo patterns. Then, an exposure hardening [133] and a separation [134] is processed; and the pattern is etched to the base of the flatness layer by an oxidation etching [135] to obtain a pattern assembly [136].

Nevertheless, while using both hot embossing imprint lithography and step and flash imprint lithography, a certain amount of resist is left on the transferred layer after the etching. According to the prior arts, a dry etching is used in the imprint lithography to remove the resist, while the dry etching takes long and is apt to harm the etched pattern. Moreover, the equipments used are usually expansive and the related required consuming components both cost high. So, the prior arts would cost high and do not satisfy all users' requests.

SUMMARY OF THE INVENTION

The main purpose of the present invention is to provide an imprint lithography utilizing silated acidic polymers with low cost and fast resist stripping.

To achieve the above purpose, the present invention is an imprint lithography method utilizing silated acidic polymers, which comprises the following steps:

(a) A Methyl methacrylate (MMA), a nomal-butylacrylate (n-BA), a Methacrylic acid (MAA) and a (3-Methacryloyloxypropyl) tris (trimethyl siloxy) silane are mixed by stirring and the mixture is processed through a free radical polymerization by addition of 2,2-Azobisisobutyronitrile [5] (AIBN) and then copolymerized into a polymer resist of a silated acidic polymer.

(b) A substrate, which is made of a polyethylene terephthalate (PET) or a polyethylene terephthalate/indium tin oxide (PET/ITO), is spin-coated with the polymer resist on an end surface and processed through a hot embossing imprint lithography with a hot-embossing machine to obtain a surface of a flexible substrate on the end surface.

(c) And, for the polymer resist is acidic, the residual of the polymer resist on the end surface of the flexible substrate is removed by a resist stripper of an environmental basic aqua-solution.

Hence, the present invention is an imprint lithography utilizing silated acidic polymers, where a plurality of monomers having at least an acidic monomer and a silated monomer are both synthesized through a copolymerization to obtain a polymer resist of a silated acidic polymer. The silated acidic polymer is an acrylic copolymer having acidic functional group and silicon atom, where the chemical resistance of the silated acidic polymer is improved with the silicon atom for using as a resist layer for imprint etching. Besides, for the polymer resist is acidic, the residual of the polymer resist on the end surface of the flexible substrate is removed by a resist stripper of an environmental basic aqua-solution without using an expansive dry etching machine system (such as a RIE) or an organic solvent so that the hot embossing imprint lithography is speeded up and the cost is lowered. Accordingly, an imprint lithography utilizing silated acidic polymers is obtained.

BRIEF DESCRIPTION OF THE DRAWINGS

The present invention will be better understood from the following detailed descriptions of the preferred embodiments according to the present invention, taken in conjunction with the accompanying drawings, in which

FIG. 3 is a view showing a formulation for a monomer of the polymer resist according to the present invention;

FIG. 6 is a view showing a formulation for producing the monomer of the polymer resist according to the present invention;

FIG. 9 is a view showing a condition for a reactive ionic etching (RIE) according to the present invention;

FIG. 11 is a view showing the resulting data of the relationship between the time and the residual thickness after RIE for the two substrates according to the present invention;

DESCRIPTION OF THE PREFERRED EMBODIMENTS

The following descriptions of the preferred embodiments are provided to understand the features and the structures of the present invention.

Figure 1A:
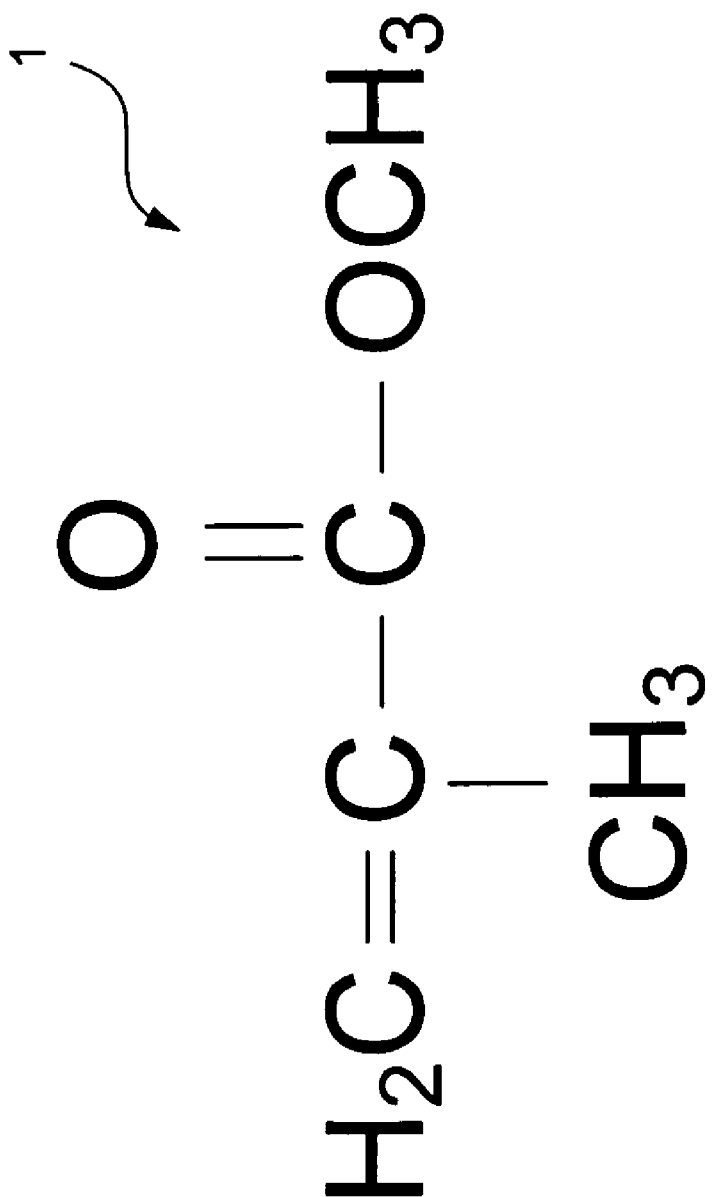
FIG. 1A through FIG. 1E are views showing molecular formulations for monomers in a polymer resist according to the present invention.
Figure 1B:
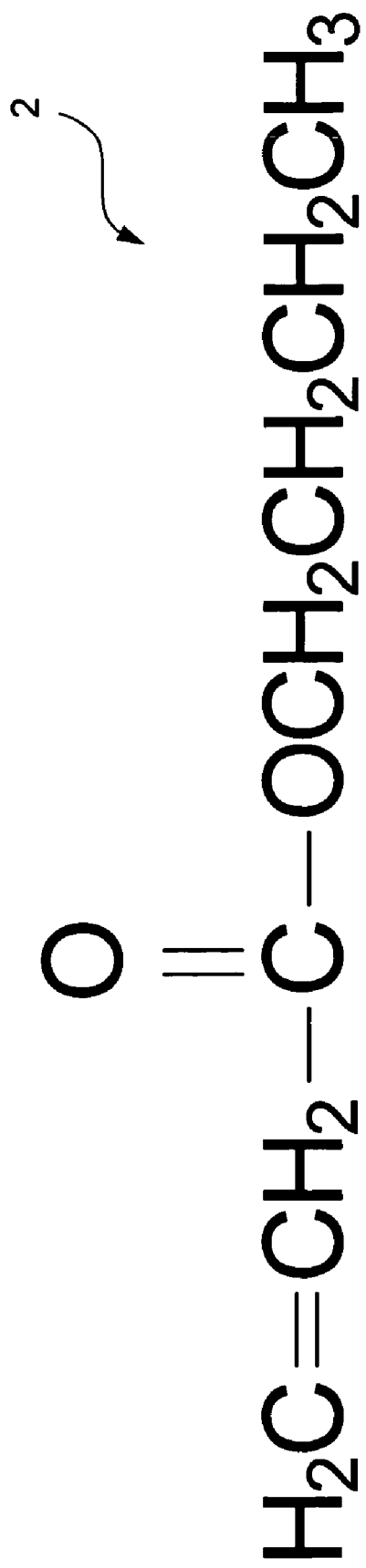
Figure 1C:
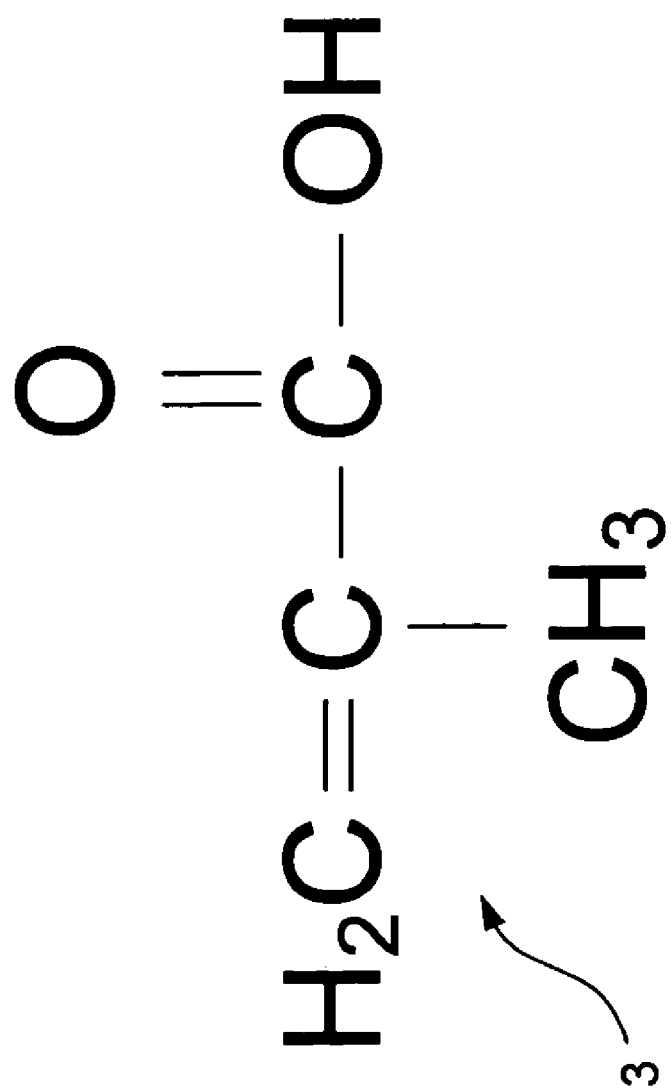
Figure 1D:
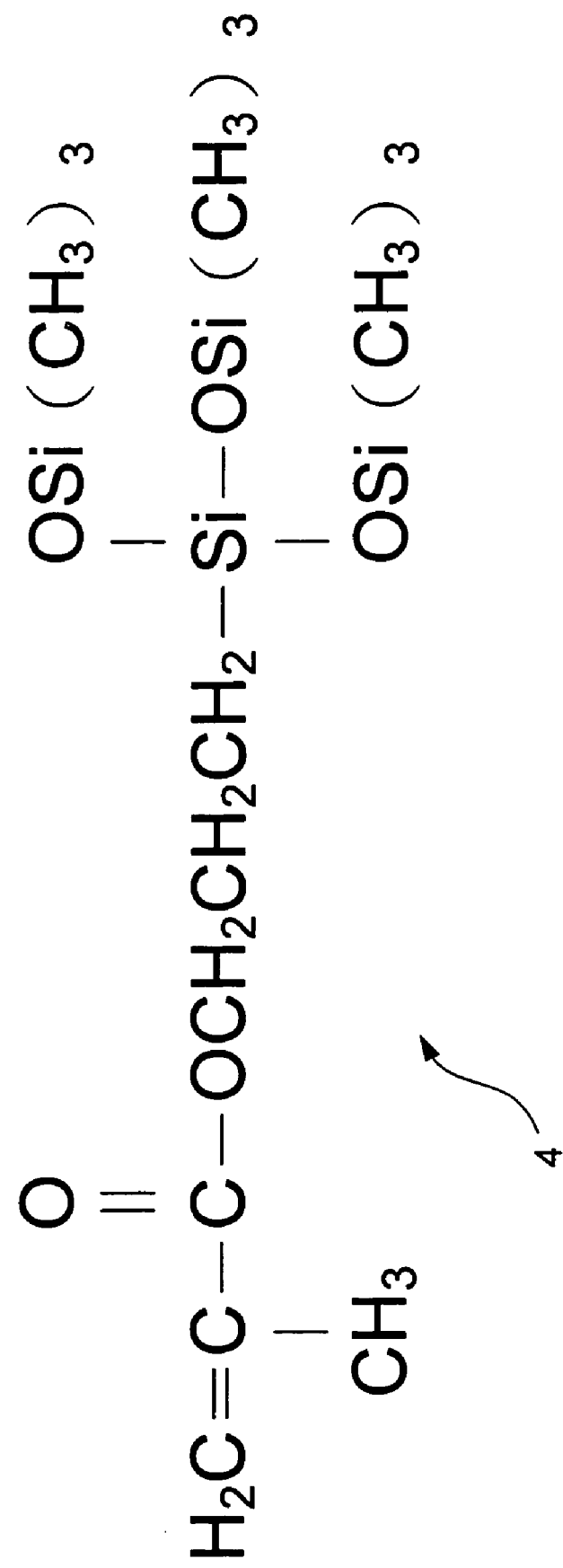
Figure 1E:
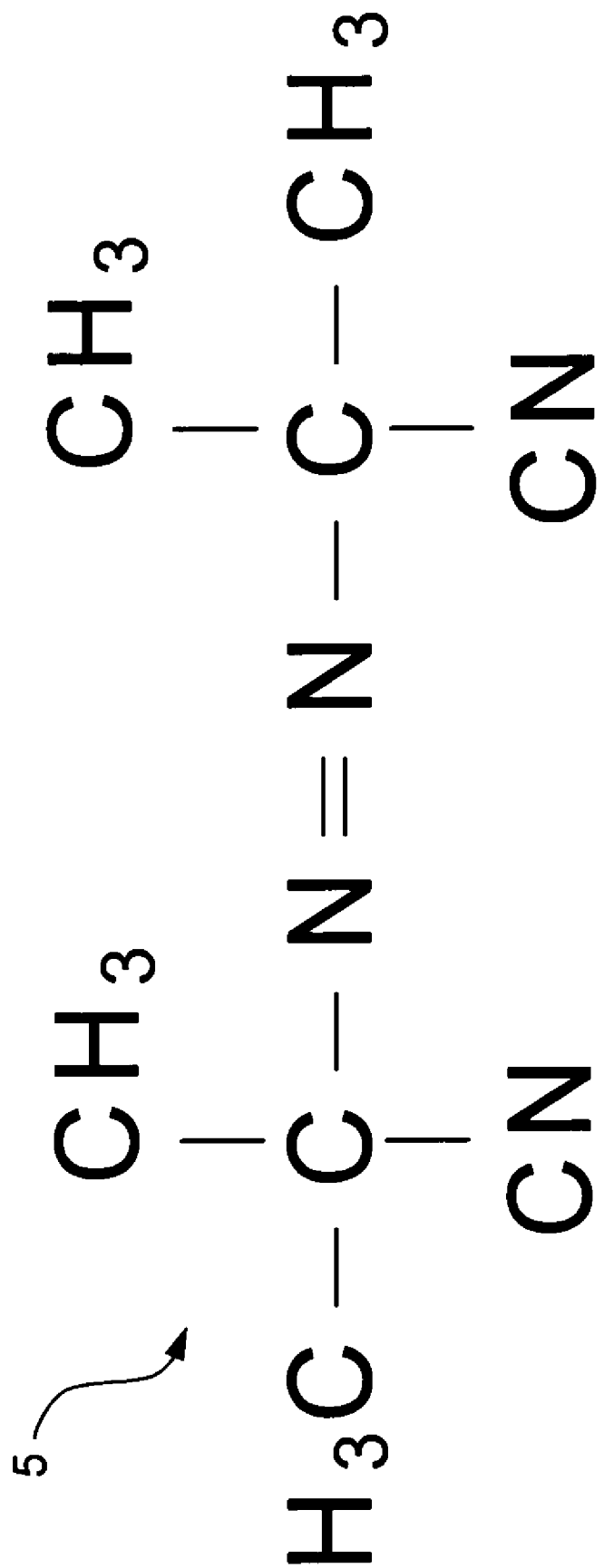
Figure 2:
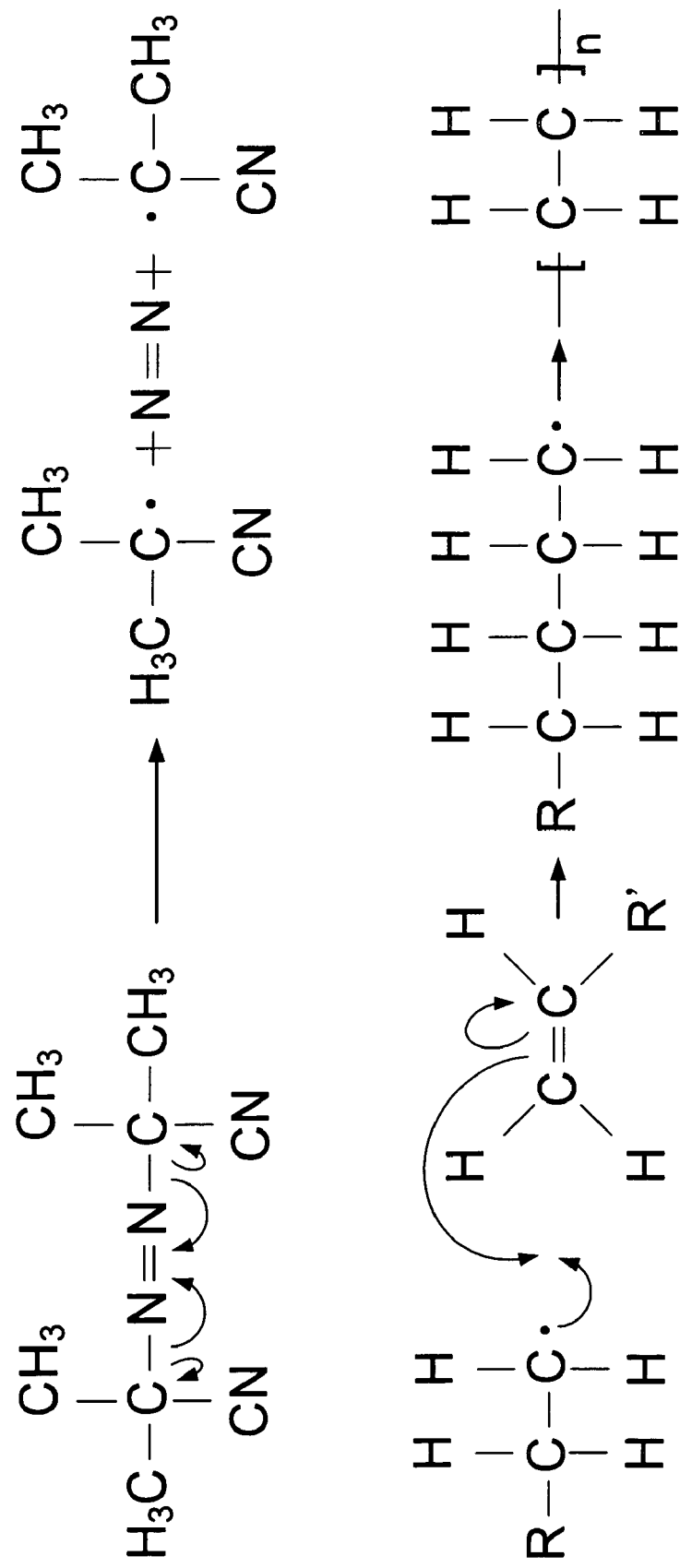
FIG. 2 is a view showing a free radical polymerization of the polymer resist according to the present invention.

Please refer to FIG. 1 through FIG. 3, which a reviews showing molecular formulations of monomers, a free radical polymerization, and a formulation of a monomer for a polymer resist according to the present invention. As shown in the figures, the present invention is an imprint lithography method utilizing silated acidic polymers, which comprises the following steps:

(a) A Methyl methacrylate [1] (MMA), a nomal-butylacrylate [2] (n-BA), a Methacrylic acid [3] (MAA) and a (3-Methacryloyloxypropyl) tris (trimethyl siloxy) silane [4] are mixed by stirring in a reaction flask and the mixture is processed through a free radical polymerization by addition of an 2,2-Azobisisobutyronitrile [5] (AIBN) and then copolymerized into a polymer resist. Therein, by adding the n-BA [2] having longer chain, the glass transition temperature (Tg) of the polymer resist is lowered; and, by adding the MAA [3] and the (3-Methacryloyloxypropyl) tris (trimethylsiloxy) silane [4], a polymer resist of a silated acidic polymer is obtained to be a resist layer for an imprint etching so that the production of a resist stripper can be fast and easy. Besides, because the silated acidic polymer is an acrylic copolymer having acidic functional group and silicon atom, the chemical resistance and the resistibility of the silated acidic polymer to the etchant is improved.

Figure 4:
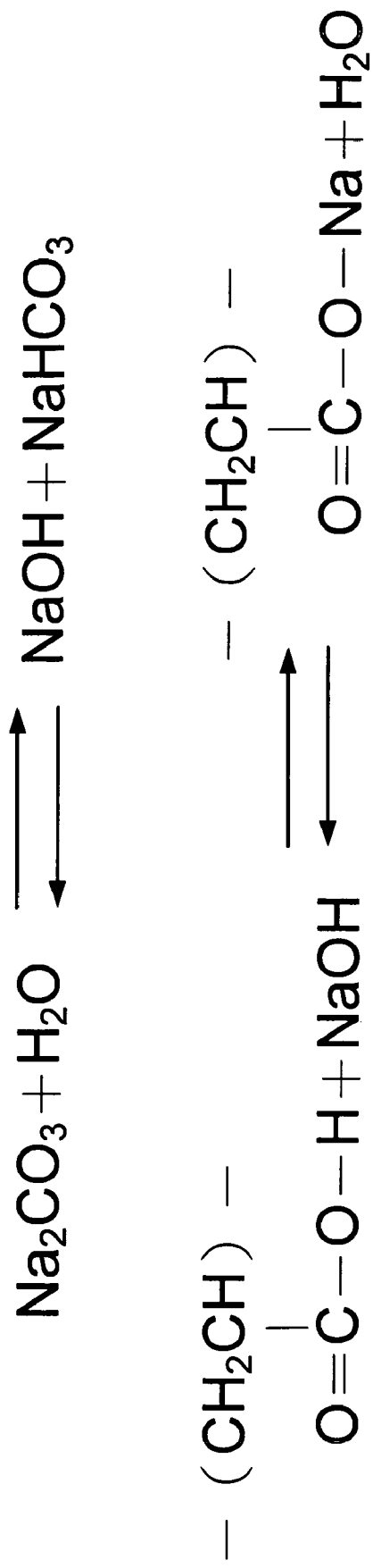
FIG. 4 is a view showing a mechanism of resist stripping of the polymer resist according to the present invention.

(b) A substrate, which is made of a polyethylene terephthalate (PET) or a polyethylene terephthalate/indium tin oxide (PET/ITO), is spin-coated with the polymer resist on an end surface and processed through a hot embossing imprint lithography with a hot-embossing machine to obtain a surface of a flexible substrate on the end surface; and (c) The residual of the polymer resist on the end surface of the flexible substrate is removed by a resist stripper of an environmental basic aqua-solution (as shown in FIG. 4) so that the surface of the flexible substrate is totally transparent, where the resist stripper is an alkaline solution of NaOH, KOH, $Na_2CO_3$ or tetramethyl ammonium hydroxide.

For further understanding, the present invention is illustrated with the following examples:

Example 1

Synthesis of Polymer Resist

Figure 5:
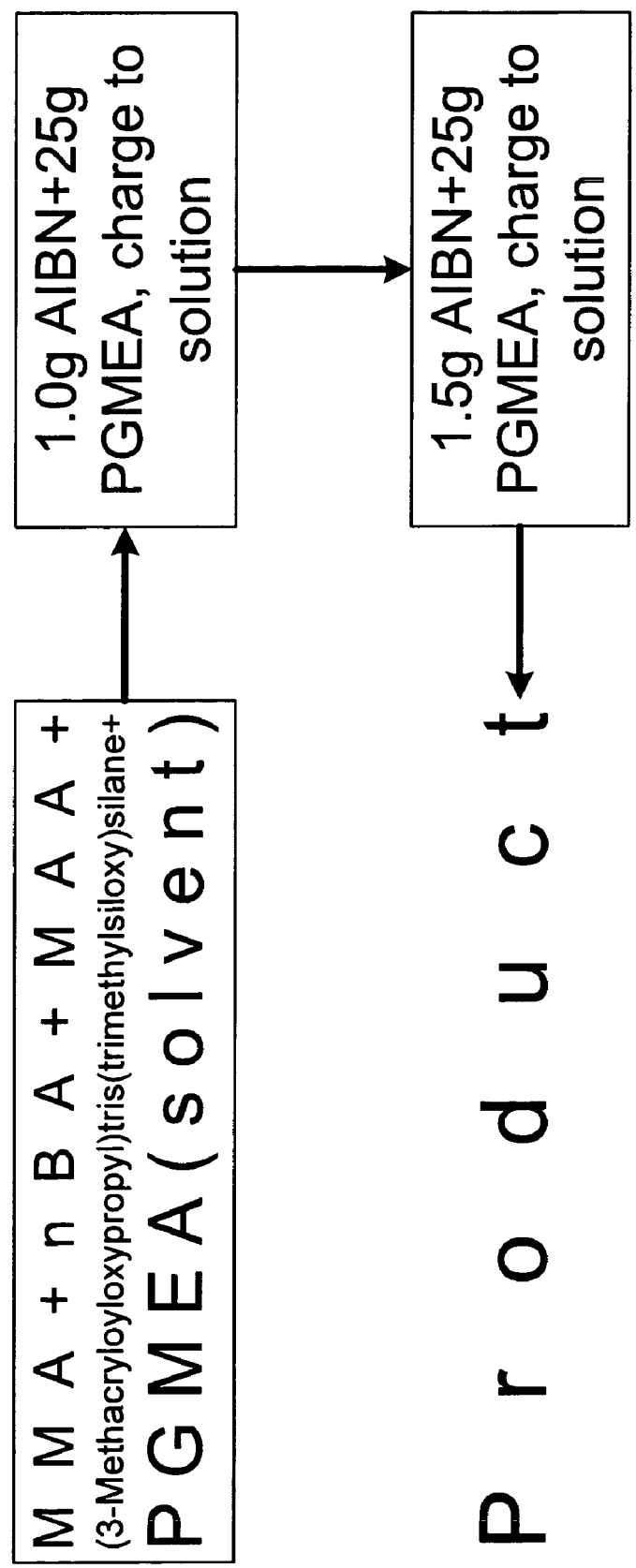
FIG. 5 is a view showing a synthesis of the polymer resist according to the present invention.

Please refer to FIG. 5 and FIG. 6, which are views showing a synthesis and a formulation for producing the monomer of the polymer resist according to the present invention. As shown in the figures, 25 g (gram) of Isopropyl alcohol (IPA), 100 g of propyleneglycol monomethyl ether acetate (PMA), 10 g of MMA, 53 g of n-BA, 16.5 g of MAA and 2.5 g of (3-Methacryloyloxypropyl) tris (trimethylsiloxy) silane are put into a 500 mL (milliliter) of reaction glass flask to be mixed by stirring in a nitrogen atmosphere. Cooling water is used to keep the temperature of the reaction flask at 90 Celsius degrees so that the quantity of solvent PMA will not be changed by evaporation under high temperature. After the stirring in the reaction flask for 30 min (minute), 1 g of AIBM is dissolved into 25 g of PMA to be titrated into the reaction flask using an addition funnel for a first addition accompanying 1 hour of mixing by stirring. After the 1 hour of mixing, another 1.50 g of AIBM is dissolved into another 25 g of PMA to be added into the reaction flask using the addition funnel for a second addition accompanying 3 hour of mixing by stirring at the same temperature. After 3 hour mixing, cool the flash to room temperature so that a polymer resist of a silated acidic polymer is obtained.

Example 2

The Hot Embossing Imprint Lithography

Figure 7A:
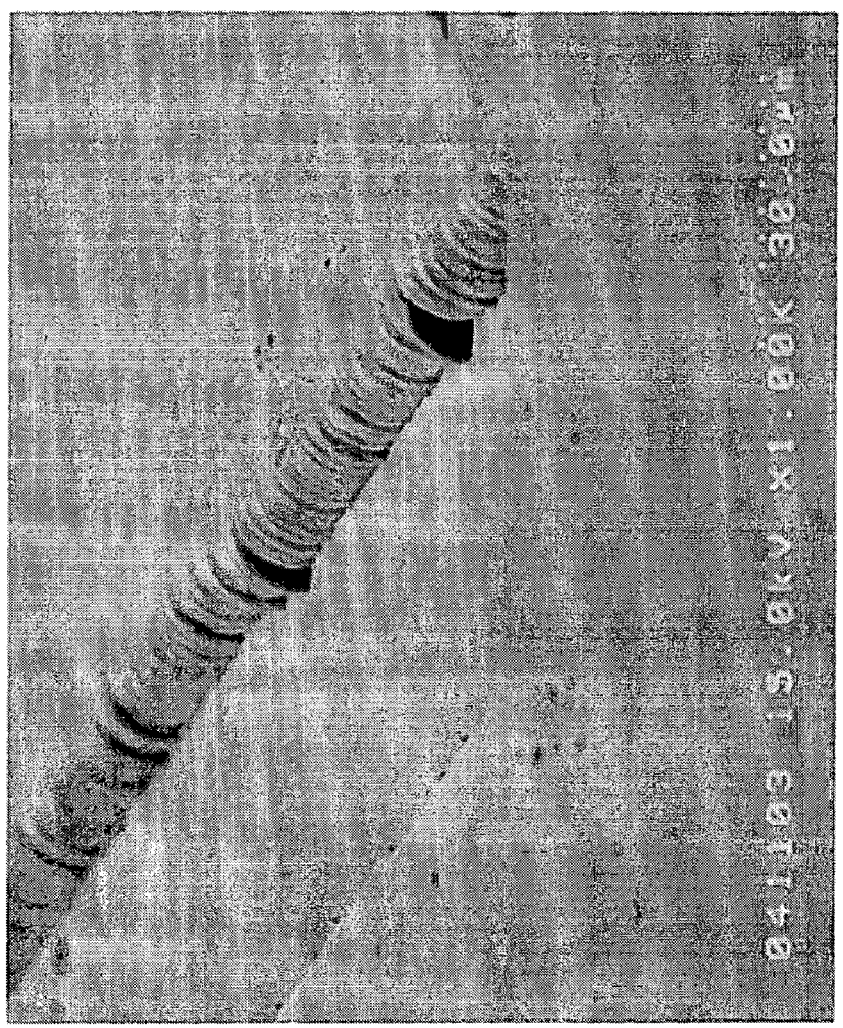
FIG. 7A and FIG. 7B are EM (electron microscope) views showing substrates after imprint lithography according to the present invention.
Figure 7B:
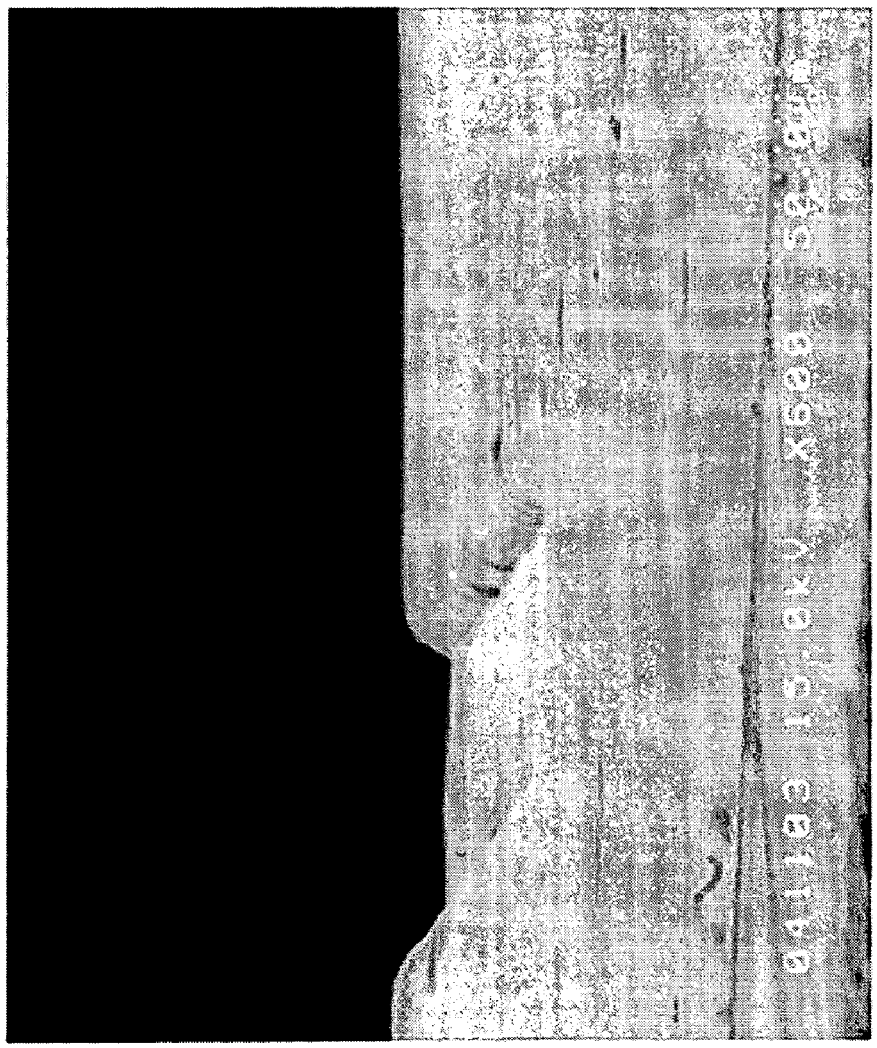

Please refer to FIG. 7A and FIG. 7B, which are EM views showing substrates after imprint lithography according to the present invention. As shown in the figures, a substrate is obtained, which is a PET having the 80 Celsius degrees of Tg and 150 Celsius degrees of decompose. The PET substrate was spin-coated with the polymer resist on an end surface and is processed through a hot embossing imprint lithography with a hot-embossing machine and a mold to form a flexible substrate with stereo transferred patterns on the end surface. The mold is made from silicon with a group of digital dig it display patterns which are 40/400 μm of line width and 10 μm of depth and the surfaced is spin-coated with diamond-like carbon as a separation layer. The hot embossing imprint lithography is run for 3 hours under 140 Celsius degrees and a pressure of 0.57 kilograms per square centimeter.

Example 3

Removing the Residual of the Polymer Resist

Figure 8A:
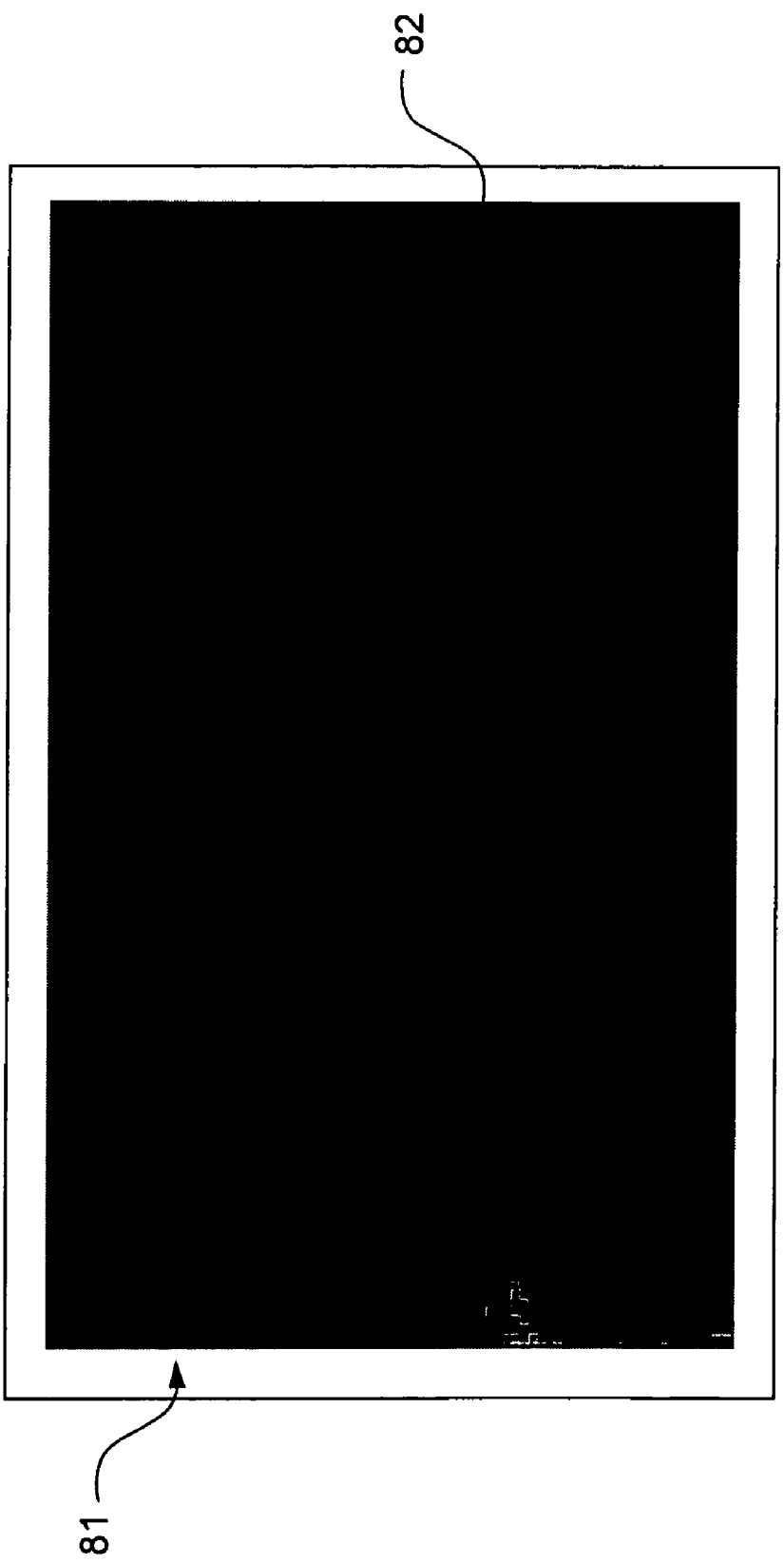
FIG. 8A and FIG. 8B a reviews showing a substrate before and after being processed through the resist stripping according to the present invention.
Figure 8B:
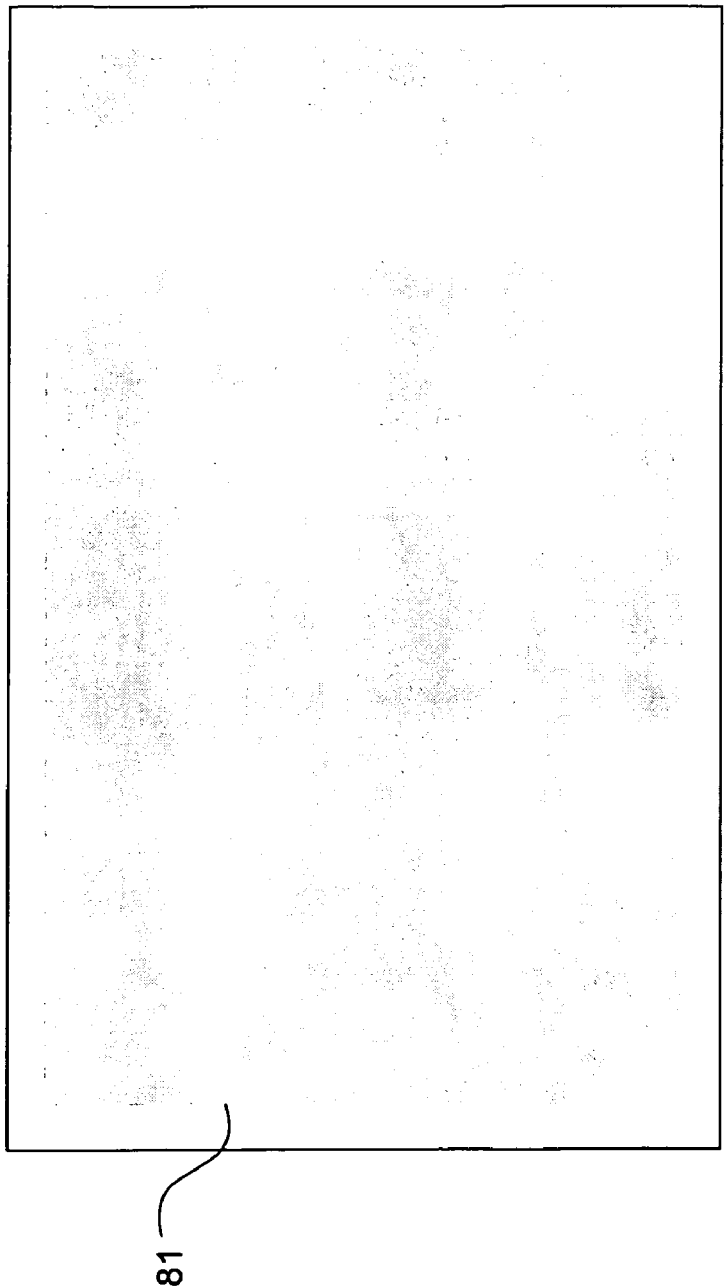

Please refer to FIG. 8A and FIG. 8B, which are views showing a substrate before and after being processed through a resist stripping according to the present invention. As shown in the figures, an alkaline solution with 2.5% of TMAH is used to remove the residual of the polymer resist [82] on the end surface of the flexible substrate [81] so that the flexible substrate [81] is totally clean with out any polymer resist [82] left.

Example 4

Test on Resistibility to Etchant

Figure 10:
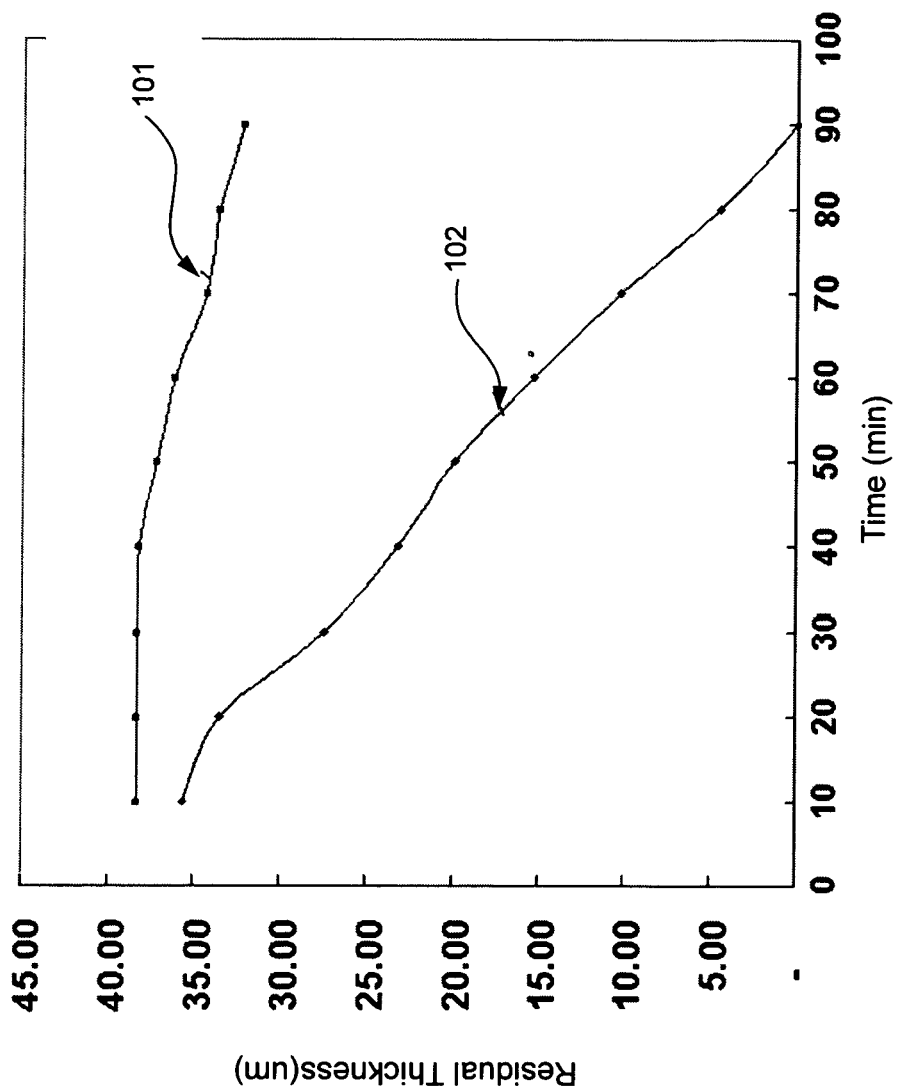
FIG. 10 is a view showing a relationship between the time and the residual thickness after RIE for two substrates according to the present invention.
Figure 12:
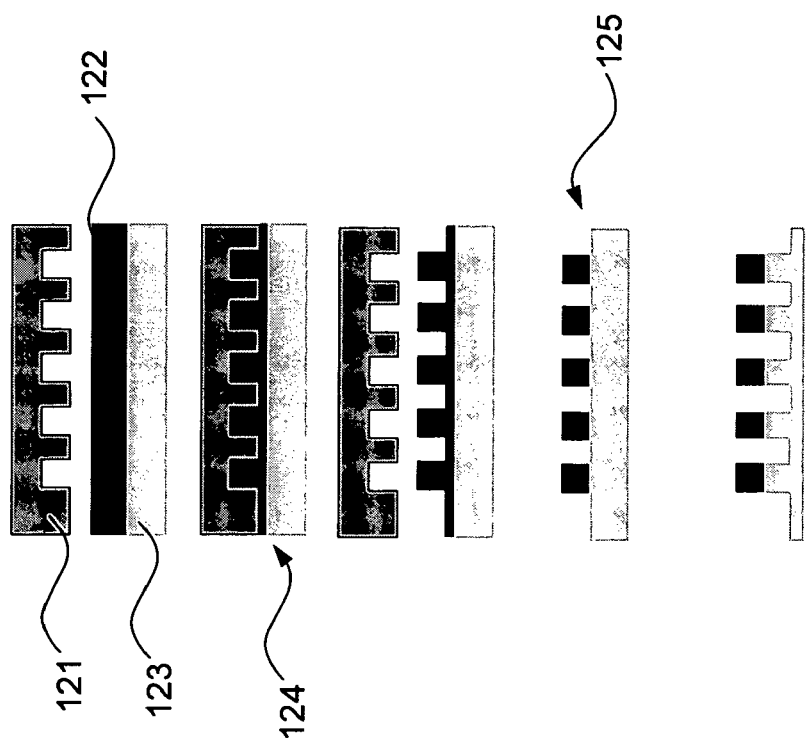
FIG. 12 is a view showing an imprint lithography according to a prior art.
Figure 13:
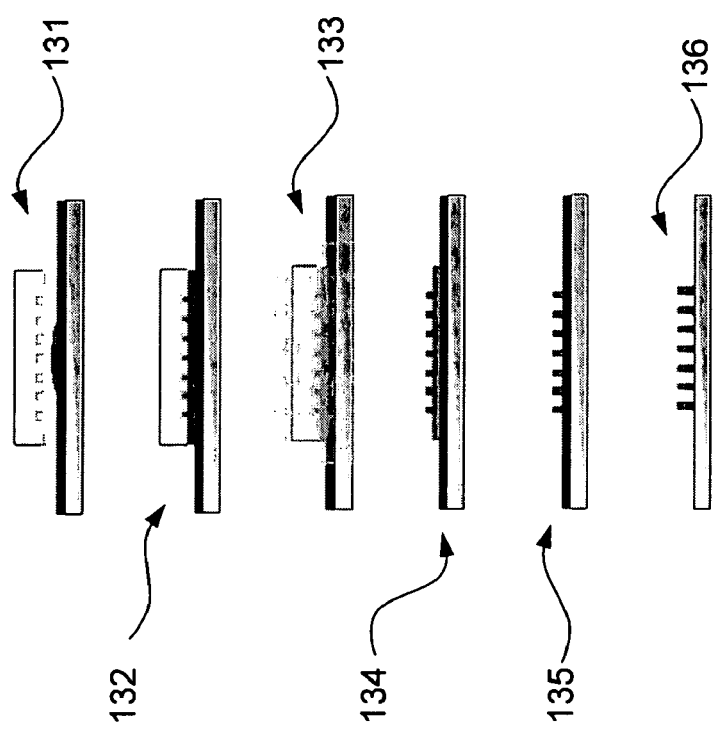
FIG. 13 is a view showing a "Step and Flash" procedure for the imprint lithography according to the prior art.

Please refer to FIG. 9 through FIG. 11, which are a view showing a condition for a reactive ionic etching (RIE) and views showing a relationship between the time and the residual thickness after RIE as well as the resulting data for two substrates according to the present invention. As shown in the figures, under the same condition, a silated acidic polymer resist [101] can resist the etchant as comparing to the acidic polymer resist [102] so that the silated acidic polymer resist [101] obtains good resistibility to the etchant.

So, the present invention is an imprint lithography utilizing silated acidic polymers, comprising: synthesizing a plurality of monomers, which comprises an acidic monomer and a silated monomer, through a copolymerization to obtain a polymer resist of a silated acidic polymer; spin-coating the polymer resist on a substrate for processing through a hot embossing imprint lithography; and, for the polymer resist is an acidic solution, removing it only by using a resist stripper of an environmental basic aqua-solution without using an expansive dry etching (such as RIE) or an organic solvent, so that the process is speeded up and the cost is lowered. In addition, for the polymer resist contains silated monomer, the chemical resistance of the polymer resist can be improved so that the substrate obtains resistibility to the etchant when etching on the residual layer. Consequently, the hot embossing imprint lithography can be faster; the machine decay and the cost of the material can be reduced; and the present invention can be applied to products in the electric and the photo-electric fields, such as flexible LCD (liquid crystal display), soft PCB (printed circuit board), base photoelectric display, etc.

To sum up, the present invention is an imprint lithography utilizing silated acidic polymers, which, by using a polymer resist of a silated acidic polymer and a resist stripper of an environmental basic aqua-solution, resistibility to the etchant can be obtained; the time for imprint lithography can be saved; and, the cost can be reduced.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. An imprint lithography method utilizing silated acidic polymers, comprising:
   (a) Mixing a Methyl methacrylate, a nomal-butylacrylate, a Methacrylic acid and a (3-Methacryloyloxypropyl) tris (trimethylsiloxy) silane by stirring in a reaction flask to form a mixture and processing the mixture through a free radical copolymerization with an 2,2-Azobisisobutyronitrile to obtain a polymer resist of silated acidic polymer;
   (b) Spin-coating a substrate with said polymer resist on an end surface of said substrate and processing said substrate through a hot embossing imprint lithography with a hot-embossing machine to obtain a surface of a flexible substrate on said end surface; and
   (c) Removing residual of said polymer resist on said end surface of said flexible substrate by a resist stripper.

2. The imprint lithography method according to claim 1, wherein said polymer resist is an imprint etching resist layer.

3. The imprint lithography method according to claim 1, wherein said substrate is made of a material selected from a group consisting of a polyethylene terephthalate and a polyethylene terephthalate/indium tin oxide.

4. The imprint lithography method according to claim 1 wherein said substrate is made of silicon wafer.

5. The imprint lithography method according to claim 1, wherein said silated acidic polymer is an acrylic copolymer having acidic functional group and silicon atom.

6. The imprint lithography method according to claim 1, where in said resist stripper is an environmental basic aqua-solution.

7. The imprint lithography method according to claim 6, wherein said environmental basic aqua-solution is selected from a group consisting of a solution of NaOH, a solution of KOH, a solution of $Na_2CO_3$ and a solution of tetramethyl ammonium hydroxide.

* * * * *